US009698389B2

(12) United States Patent
Okamoto et al.

(10) Patent No.: US 9,698,389 B2
(45) Date of Patent: Jul. 4, 2017

(54) METHOD OF PRODUCING ORGANIC EL DEVICE

(71) Applicant: SEIKO EPSON CORPORATION, Tokyo (JP)

(72) Inventors: Tatsuya Okamoto, Chino (JP); Takefumi Fukagawa, Fujimi-machi (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 15/040,755

(22) Filed: Feb. 10, 2016

(65) Prior Publication Data

US 2016/0260936 A1 Sep. 8, 2016

(30) Foreign Application Priority Data

Mar. 5, 2015 (JP) .................................. 2015-043263
Sep. 14, 2015 (JP) .................................. 2015-180446

(51) Int. Cl.
*H01L 51/56* (2006.01)
*H01L 51/52* (2006.01)

(52) U.S. Cl.
CPC .......... *H01L 51/56* (2013.01); *H01L 51/5253* (2013.01); *H01L 51/5246* (2013.01); *H01L 2251/55* (2013.01)

(58) Field of Classification Search
CPC ............. H01L 51/5237; H01L 51/5253; H01L 51/5256; H01L 51/56
See application file for complete search history.

(56) References Cited

U.S. PATENT DOCUMENTS

| 2006/0088951 | A1  | 4/2006 | Hayashi et al. |
| 2007/0114519 | A1* | 5/2007 | Hayashi ............... H01L 51/5253 257/40 |
| 2007/0132381 | A1  | 6/2007 | Hayashi et al. |
| 2009/0115321 | A1  | 5/2009 | Hayashi |
| 2014/0117842 | A1  | 5/2014 | Hanamura |

FOREIGN PATENT DOCUMENTS

| JP | 2006-147528 A | 6/2006 |
| JP | 2007-069548 A | 3/2007 |
| JP | 2007-141750 A | 6/2007 |
| JP | 2007-157606 A | 6/2007 |
| JP | 2009-117079 A | 5/2009 |
| JP | 2010-231908 A | 10/2010 |
| JP | 2014-089804 A | 5/2014 |

* cited by examiner

*Primary Examiner* — Daniel Shook
(74) *Attorney, Agent, or Firm* — Oliff PLC

(57) ABSTRACT

A method of producing an organic EL device includes forming an organic EL element including a pixel electrode, a functional layer, and a counter electrode over a substrate, forming a cathode protective layer over the organic EL element, forming a cover layer over the cathode protective layer, forming an organic buffer layer over the cover layer, and forming a gas barrier layer over the organic buffer layer.

9 Claims, 9 Drawing Sheets

FIG. 13

| | MATERIAL | FILM FORMATION STABILITY | CUSHIONING CHARACTERISTICS | YOUNG MODULUS (GPa) | CHEMICAL STABILITY TO EPOXY |
|---|---|---|---|---|---|
| A | LOW-MOLECULAR COMPOUND | EXCELLENT | FAIR | — | GOOD |
| B | POLYIMIDE | GOOD | EXCELLENT | 3.0 – 5.0 | EXCELLENT |
| C | POLYETHYLENE | EXCELLENT | GOOD | 0.4 – 1.1 | EXCELLENT |
| D | POLYURIA | GOOD | FAIR | 6.9 | EXCELLENT |
| E | POLYURETHANE | GOOD | FAIR | — | EXCELLENT |
| F | POLYTETRAFLUOROETHYLENE | EXCELLENT | EXCELLENT | 0.5 | GOOD |
| G | ACRYLIC | GOOD | EXCELLENT | 1.6 – 3.4 | EXCELLENT |
| H | VINYL POLYMER | GOOD | EXCELLENT | 2.5 – 4.2 | EXCELLENT |
| I | POLYESTER | FAIR | EXCELLENT | 1.8 – 3.5 | EXCELLENT |
| J | POLYPROPYLENE | FAIR | EXCELLENT | 0.9 | EXCELLENT |
| K | POLYSTYRENE | FAIR | EXCELLENT | 3.0 – 3.4 | EXCELLENT |

METHOD OF PRODUCING ORGANIC EL DEVICE

BACKGROUND

1. Technical Field

The present invention relates to a method of producing an organic EL device.

2. Related Art

An organic EL (electroluminescent) device includes a light emitting element in which a light emitting layer (functional layer) formed of an organic light emitting material is situated between an anode (pixel electrode) and a cathode (counter electrode). In the organic EL device, the light emitting layer, the cathode, a cathode protective layer, an organic buffer layer, and a gas barrier layer are stacked in this order from the side of the substrate, for example.

As described in JP-A-2007-69548, for example, a screen printer is used to produce the organic buffer layer. The method of producing the organic EL device includes disposing a screen mesh above the cathode protective layer disposed over the substrate, printing (transferring) a printing material in a pattern by using a squeegee, and removing the screen mesh.

The organic buffer layer preferably has a smaller thickness to reduce the overall thickness of the organic EL device for improving luminance. However, a portion of a printer or a transfer apparatus (a screen mesh of a screen printer, for example) may come in contact with the cathode protective layer during the formation of such an organic buffer layer having a small thickness. The contact may cause damage such as the formation of a crack to the cathode protective layer, and a component of the organic buffer layer (epoxy resin, for example) may enter the cathode protective layer through the crack. This may lead to deterioration of the cathode positioned below the cathode protective layer. As a result, the organic EL device may have a non-light-emitting area.

SUMMARY

An advantage of some aspects of the invention is that a method that can solve at least a part of the above-described problem is provided. The aspects of the invention may be embodied as the following embodiment or examples.

EXAMPLE 1

A method of producing an organic EL device of this example includes forming an organic EL element including a pixel electrode, a functional layer, and a counter electrode over a substrate, forming a cathode protective layer over the organic EL element, forming a cover layer over the cathode protective layer, forming an organic buffer layer over the cover layer, and forming a gas barrier layer over the organic buffer layer.

In this example, the cover layer is formed between the cathode protective layer and the organic buffer layer. With this configuration, the cathode protective layer positioned below the cover layer is unlikely to be damaged when a portion of an apparatus for forming the organic buffer layer comes in contact with a partially formed organic EL element board during the formation of the organic buffer layer, for example. Thus, a crack in the cathode protective layer, possibly due to a direct contact between the portion of the apparatus and the cathode protective layer, is prevented, reducing deterioration of the counter electrode disposed below the cathode protective layer. As a result, generation of a non-light-emitting area is reduced.

EXAMPLE 2

In the method of producing the organic EL device of the above-described example, the organic buffer layer may be formed over the cover layer by a screen printing technique.

In this example, during the formation of the organic buffer layer by the screen printing technique, the cathode protective layer is unlikely to be directly damaged when a portion of a screen printer comes in contact with the partially formed organic EL element board, since the cover layer is preliminarily formed over the cathode protective layer. Thus, deterioration of the counter electrode is reduced.

EXAMPLE 3

In the method of producing the organic EL device of the above-described example, the cover layer may be formed such that an edge of the cover layer is positioned outwardly from an edge of a display area in plan view and positioned inwardly from an edge of each of the cathode protective layer and the gas barrier in plan view.

In this example, since the edge of the cover layer is positioned outwardly from the display area in plan view, the cover layer at least covers the display area (light emitting area). With this configuration, the display area (light emitting area) is protected by the cover layer if a portion of the screen printer comes in contact with the partially formed organic EL element board during the formation of the organic buffer layer by the screen printing technique.

EXAMPLE 4

In the method of producing the organic EL device of the above-described examples, the cover layer may have a thickness in a range of 100 nm to 500 nm.

In this example, since the cover layer has the thickness in the above-described range, the cover layer is able to absorb the stress caused by the contact between a portion of the screen printer and the partially formed organic EL element board. Thus, the cathode protective layer positioned below the cover layer is unlikely to be damaged.

EXAMPLE 5

In the method of producing the organic EL device of the above-described examples, the cover layer may be formed of an organic low-molecular-weight material.

In this example, since the cover layer is formed of the organic low-molecular-weight material, the cover layer functions as a cushion when the cover layer has physical contact. Thus, the cathode protective layer positioned below the cover layer is unlikely to be damaged.

EXAMPLE 6

A method of producing an organic EL device in this example includes forming an organic EL element including a pixel electrode, a functional layer, and a counter electrode over a substrate, forming a cathode protective layer over the organic EL element, forming a cover layer having a Young's modulus in a range of 0.1 GPa to 10 GPa over the cathode protective layer, forming an organic buffer layer over the cover layer, and forming a gas barrier layer over the organic buffer layer.

In this example, the cover layer is formed between the cathode protective layer and the organic buffer layer. With this configuration, the cathode protective layer positioned below the cover layer is unlikely to be damaged when a portion of an apparatus for forming the organic buffer layer comes in contact with a partially formed organic EL element board during the formation of the organic buffer layer, for example. Thus, a crack in the cathode protective layer, possibly due to a direct contact between the portion of the apparatus and the cathode protective layer, is prevented, reducing deterioration of the counter electrode positioned below the cathode protective layer. As a result, generation of a non-light-emitting area is reduced. In addition, since the cover layer has the Young's modulus in the range of 1 GPa to 5 GPa, the cover layer absorbs physical damage (functions as a cushion). Thus, the cathode protective layer positioned below the cover layer is unlikely to be damaged.

EXAMPLE 7

In the method of producing the organic EL device of the above-described example, the organic buffer layer may be formed over the cover layer by a screen printing technique.

In this example, during the formation of the organic buffer layer by the screen printing technique, the cathode protective layer is unlikely to be directly damaged when a portion of a screen printer comes in contact with the partially formed organic EL element board, since the cover layer is preliminarily formed over the cathode protective layer. Thus, deterioration of the counter electrode is reduced.

EXAMPLE 8

In the method of producing the organic EL device of the above-described example, the cover layer may be formed such that an edge of the cover layer is positioned outwardly from an edge of a display area in plan view and positioned inwardly from each of the cathode protective layer and the gas barrier in plan view.

In this example, since the edge of the cover layer is positioned outwardly from the edge of the display area in plan view, the cover layer at least covers the display area (light emitting area). With this configuration, the display area (light emitting area) is protected by the cover layer if a portion of the screen printer comes in contact with the partially formed organic EL element board during the formation of the organic buffer layer by the screen printing technique.

EXAMPLE 9

In the method of producing the organic EL device of the above-described examples, the cover layer may have a thickness in a range of 100 nm to 500 nm.

In this example, since the cover layer has the thickness in the above-described range, the cover layer is able to absorb the stress caused by a contact between a portion of the screen printer and the partially formed organic EL element board. Thus, the cathode protective layer positioned below the cover layer is unlikely to be damaged.

EXAMPLE 10

In the method of producing the organic EL device of the above-described examples, the cover layer may be formed of an organic compound material.

In this example, since the cover layer is formed of the organic compound material, the cover layer functions as a cushion when the cover layer has physical contact. Thus, the cathode protective layer positioned below the cover layer is unlikely to be damaged.

EXAMPLE 11

In the method of producing the organic EL device of the above-described example, the organic compound material may be a high-molecular-weight compound.

In this example, since the cover layer is formed of the high-molecular-weight compound, the cover layer functions as a cushion when the cover layer has physical contact. Thus, the cathode protective layer positioned below the cover layer is unlikely to be damaged.

BRIEF DESCRIPTION OF THE DRAWINGS

The invention will be described with reference to the accompanying drawings, wherein like numbers reference like elements.

FIG. 13 is a chart indicating characteristics of organic compound materials for comparison.

DESCRIPTION OF EXEMPLARY EMBODIMENTS

Figure 1:
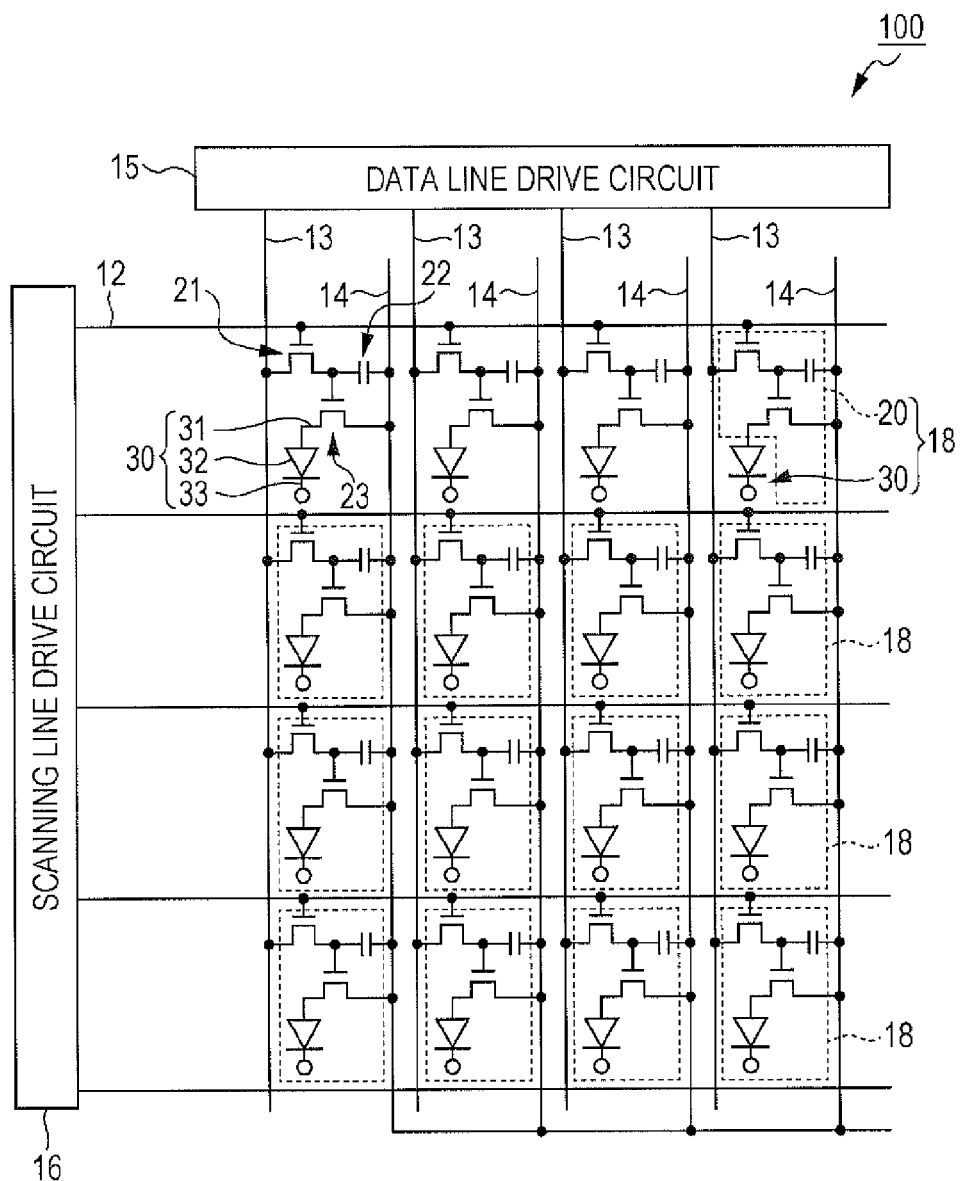
FIG. 1 is an equivalent circuit diagram indicating an electrical configuration of an organic EL device according to the present embodiment.

Hereinafter, an embodiment of the invention is described with reference to the drawings. In the drawings, some portions are magnified or demagnified for ease of understanding of the portions.

In the following embodiment, when a component is described as being disposed "over" a base member, for example, the component may be in contact with the base member, may be positioned above the base member with another component being disposed therebetween, or may be partly in contact with the base member and partly positioned above the substrate with another component being disposed therebetween, unless otherwise specified.

Organic EL Device

Figure 2:
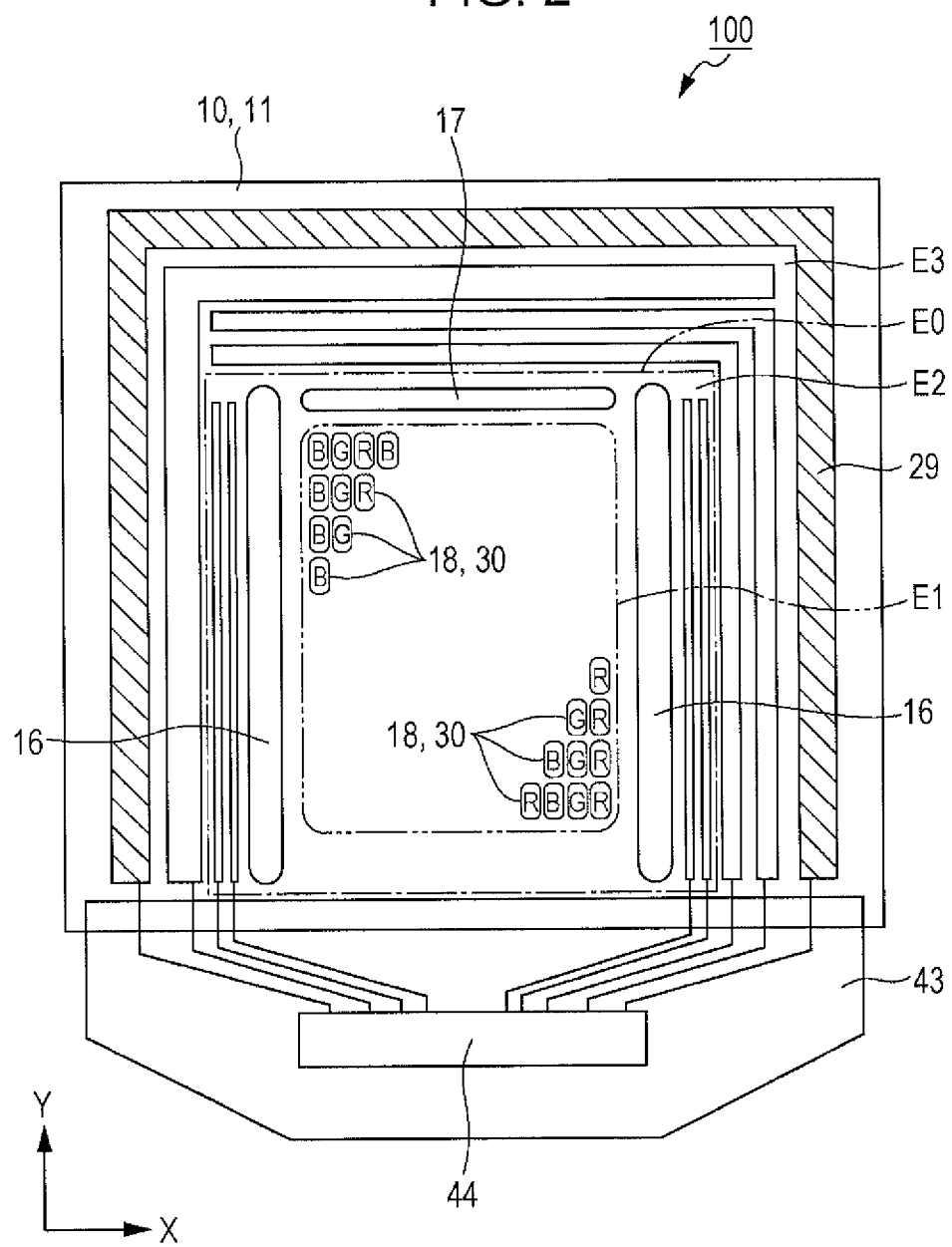
FIG. 2 is a schematic plan view illustrating a configuration of the organic EL device.
Figure 3:
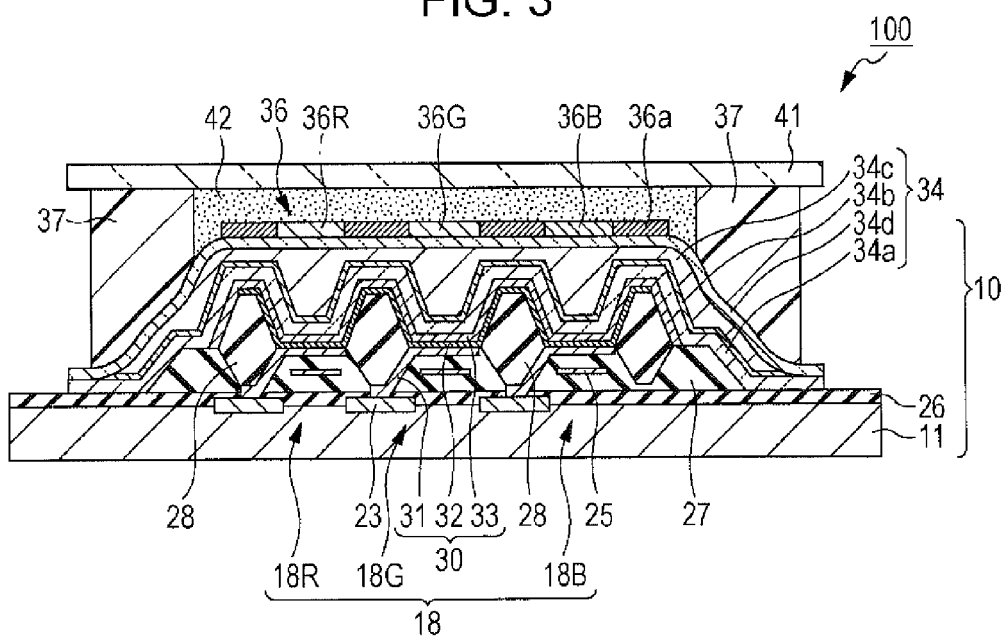
FIG. 3 is a schematic cross-sectional view illustrating an overall configuration of the organic EL device.

An organic EL device of the present embodiment is described with reference to FIG. 1 to FIG. 3. FIG. 1 is an equivalent circuit diagram indicating an electrical configuration of the organic EL device of the embodiment. FIG. 2 is a schematic plan view illustrating a configuration of the organic EL device of the embodiment. FIG. 3 is a schematic cross-sectional view illustrating an overall configuration of the organic EL device.

As illustrated in FIG. 1, an organic EL device 100 of the embodiment includes a plurality of scanning lines 12, a plurality of data lines 13, and a plurality of power lines 14 each extending parallel to the data lines 13. The organic EL device 100 further includes a scanning line drive circuit 16 to which the scanning lines 12 are connected, and a data line drive circuit 15 to which the data lines 13 are connected. In addition, the organic EL device 100 includes a plurality of sub pixels 18 in a matrix at intersections between the scanning lines 12 and the data lines 13.

The sub pixels 18 each include an organic EL element 30, which is a light emitting element, and a pixel circuit 20, which controls the driving of the organic EL element 30.

The organic EL element 30 includes a pixel electrode 31, a counter electrode 33, which is a common electrode, and a functional layer 32, which is an organic light emitting layer and disposed between the pixel electrode 31 and the counter electrode 33. Such an organic EL element 30 can be called a diode from an electrical point of view. The counter electrode 33 is a common cathode disposed over the sub pixels 18, which is described in detail later.

The pixel circuit 20 includes a switching transistor 21, a storage capacitor 22, and a drive transistor 23. The transistors 21 and 23 each may be an n-channel or p-channel thin film transistor (TFT) or an n-channel or p-channel MOS transistor.

A gate of the switching transistor 21 is connected to the scanning line 12, one of a source and a drain thereof is connected to the date line 13, and the other of the source and the drain is connected to a gate of the drive transistor 23.

One of a source and a drain of the drive transistor 23 is connected to the pixel electrode 31 of the organic EL element 30, and the other of the source and the drain thereof is connected to the power line 14. The storage capacitor 22 is connected between the gate of the drive transistor 23 and the power line 14.

When the switching transistor 21 is turned on by activation of the scanning line 12, a potential based on an image signal transmitted through the data line 13 is transferred to the storage capacitor 22 through the switching transistor 21.

The drive transistor 23 is in an on state or an off state depending on the potential of the storage capacitor 22, i.e., a gate potential of the drive transistor 23. When the drive transistor 23 is in the on state, an electric current starts to flow from the power line 14 to the functional layer 32, which is situated between the pixel electrode 31 and the counter electrode 33, through the drive transistor 23 in an amount corresponding to the gate potential. The organic EL element 30 emits light in intensity corresponding to the amount of an electric current flowing through the functional layer 32.

As illustrated in FIG. 2, the organic EL device 100 includes an organic EL element board 10. The organic EL element board 10 includes a display area E0 (indicated by a one-dotted chain line in FIG. 2) and a non-display area E3 outside the display area E0. The display area E0 includes an actual display area E1 (indicated by a two-dotted chain line in FIG. 2) and a dummy area E2 surrounding the actual display area E1.

In the actual display area E1, the sub pixels 18 as light emitting pixels are arranged in a matrix. The sub pixels 18 each include the organic EL element 30 as described above, and the organic EL element 30 emits one of blue (B), green (G), and red (R) light in response to the operation of the switching transistor 21 and the drive transistor 23.

In the embodiment, the sub pixels 18 are arranged in a stripe arrangement. Specifically, the sub pixels 18 are arranged such that the sub pixels 18 arranged in a first direction emit light of the same color, and the sub pixels 18 adjacent to each other in a second direction, which intersects (is perpendicular to) the first direction, emit light of different colors. Hereinafter, the first direction and the second direction are referred to as a Y direction and an X direction, respectively. The arrangement of the sub pixels 18 in the organic EL element board 10 is not limited to the stripe arrangement, and may be a mosaic arrangement, or a delta arrangement.

The dummy area E2 mainly has peripheral circuits for causing the organic EL element 30 of each sub pixel 18 to emit light, for example. As illustrated in FIG. 2, two scanning line drive circuits 16 extend in the Y direction in the dummy area E2 such that the actual display area E1 is positioned therebetween in the X direction. A detection circuit 17 extends between the two scanning line drive circuits 16 along the actual display area E1.

A flexible printed circuit (FPC) 43 is connected to a marginal portion of the organic EL element board 10 extending in the X direction (lower marginal portion in FIG. 2) so as to have an electrical connection with an external drive circuit. A drive IC 44 is mounted on the FPC 43 such that the drive IC 44 is connected to the peripheral circuits in the organic EL element board 10 through the FPC 43. The drive IC 44 includes the date line drive circuit 15 described above. The data lines 13 and the power lines 14 in the organic EL element board 10 are electrically connected to the drive IC 44 through the FPC 43.

In an area between the display area E0 and an outer edge of the organic EL element board 10, i.e., in the non-display area E3, a wire 29 configured to apply a potential to the counter electrode 33 of the organic EL element 30 in each of the sub pixels 18, for example, is disposed. The wire 29 extends on the organic EL element board 10 along sides of the display area E0, except for a side including the marginal portion of the organic EL element board 10 to which the FPC 43 is connected.

The configuration of the organic EL device is described with reference to FIG. 3. FIG. 3 is a schematic cross-sectional view illustrating the configuration of the organic EL device. The organic EL device in this embodiment is a top emission organic EL device.

As illustrated in FIG. 3, in the organic EL device 100, the organic EL element board 10 faces a counter board 41 with a bonding layer 42 disposed therebetween.

Specifically, a wire and the drive transistor 23 (see FIG. 1) are disposed on a base member 11, which corresponds to a substrate as a component of the organic EL element board 10, and the pixel electrodes 31 are disposed over the wire and the drive transistor 23. In addition, the functional layer 32 including an organic light emitting layer, for example, is disposed over the pixel electrodes 31. The counter electrode 33, which functions as a cathode, covers the functional layer 32.

A portion of the functional layer 32 sandwiched between the pixel electrode 31 and the counter electrode 33 and corresponding portions of the pixel electrode 31 and the counter electrode 33 constitute the organic EL element 30.

In addition, a sealing layer 34 is disposed over the counter electrode 33 over substantially the entire area of the base member 11. A color filter 36 is disposed over the sealing layer 34 over substantially the entire area of the functional layer 32 in plan view. The bonding layer 42 is disposed over the color filter 36. The counter board 41 is disposed over the bonding layer 42.

The base member 11 may be a transparent board, such as a glass board, or may be an opaque board, such as a silicon board or a ceramic board, since the organic EL device 100 is a top emission organic EL device.

An insulating layer 26 covers the wire and the drive transistors 23 on the base member 11. The insulating layer 26 includes contact holes, which are not illustrated, so as to allow electrical connection between the pixel electrodes 31 and the drive transistors 23. A planarizing insulating layer 27 including a reflective layer 25 mounted therein is disposed over the insulating layer 26. The reflective layer 25 is formed of an aluminum alloy, for example.

The light emitted from the functional layer 32 is reflected by the reflective layer 25, and then passes through the color filter 36 and exits through the counter board 41.

The organic EL element 30 including the pixel electrode 31, the functional layer 32, and the counter electrode 33 is disposed over the planarizing insulating layer 27. In addition, insulating pixel partitions 28 are disposed so as to separate the organic EL element 30 into sections.

The pixel electrode 31 is formed of a transparent conductive film such as an ITO (indium tin oxide) film. If the reflective layer 25 is not mounted in each of the sub pixels 18, the pixel electrode 31 may be formed of aluminum or an aluminum alloy, which is able to reflect light.

The functional layer 32 is formed by a gas-phase process such as a vacuum deposition process or an ion plating process so as to be in contact with the pixel electrodes 31.

The functional layer 32 includes a hole injection layer, a hole transport layer, an organic light emitting layer, and an electron transport layer, for example. In the present embodiment, the hole injection layer, the hole transport layer, the organic light emitting layer, and the electron transport layer are formed on the pixel electrodes 31 in this order by the gas-phase process to obtain the functional layer 32. However, the configuration of the functional layer 32 is not limited to the above, and may further include an intermediate layer that controls movement of holes or electrons, which are carriers.

The organic light emitting layer may have any configuration that enables emission of white light. The organic light emitting layer may be a combination of an organic light emitting layer that emits red light, an organic light emitting layer that emits green light, and an organic light emitting layer that emits blue light, for example.

The counter electrode 33 is disposed over the functional layer 32. The counter electrode 33 is a film formed of an alloy of magnesium (Mg) and silver (Ag) and has a thickness that allows the counter electrode 33 to have light permeability and light reflectivity. The organic EL elements 30 are formed in this way.

The counter electrode 33 having light permeability and light reflectivity may constitute an optical resonator in combination with each of the reflective layers 25 of sub pixels 18R, 18G, and 18B.

The sealing layer 34 is disposed over the organic EL elements 30 so as to prevent entry of water or oxygen. The sealing layer 34 of the embodiment includes a cathode protective layer 34a, a cover layer 34b, an organic buffer layer 34c, and a gas barrier layer 34d in this order from the side of the counter electrode 33.

The cathode protective layer 34a is preferably formed of a silicon based material having light permeability and a high gas barrier property, such as silicon oxynitride (SiON). The cathode protective layer 34a may be formed of silicon dioxide ($SiO_2$). The thickness of the cathode protective layer 34a is about 200 nm, for example.

The cover layer 34b is disposed over the cathode protective layer 34a. The cover layer 34b is disposed between the cathode protective layer 34a and the organic buffer layer 34c, which is described later. This configuration prevents a portion of a screen printer (a screen mesh, or a screen printing plate 51 (see FIG. 8), for example) from damaging the cathode protective layer 34a if the portion of the screen printer comes in contact with the partially formed organic EL element board 10 during the formation of the organic buffer layer 34c by the screen printing technique.

Since the cover layer 34b functions as a cushion if the screen printing plate 51 (see FIG. 8) comes in contact with the partially formed organic EL element board 10 during the formation of the organic buffer layer 34c having a small thickness, the cathode protective layer 34a is unlikely to be damaged, reducing deterioration of the counter electrode 33. As a result, generation of a non-light-emitting area is reduced. In addition, since this configuration enables the formation of the organic buffer layer 34c having a small thickness, luminance of the light from the organic EL device 100 is improved.

Examples of the material of the cover layer 34b include an organic low-molecular compound such as tris(8-hydroxyquinolinato)aluminum (Alq3). The thickness of the cover layer 34b is in the range of about 100 nm to 500 nm, for example. The cover layer 34b formed of the organic material and having the thickness in the above-described range functions as a cushion and absorbs stress when a portion of the screen printer comes in contact with the partially formed organic EL element board 10. Thus, the cathode protective layer 34a positioned below the cover layer 34b is unlikely to be damaged.

The cover layer 34b preferably has the edge positioned outwardly from the edge of the display area E0 (actual display area E1) in plan view and positioned inwardly from the edge of each of the cathode protective layer 34a and the gas barrier layer 34d in plan view.

The organic buffer layer 34c is disposed over the cover layer 34b. The organic buffer layer 34c fills concave portions of the cathode protective layer 34a formed in an undulating shape by the pixel partitions 28. The upper surface of the organic buffer layer 34c is substantially flat. The organic buffer layer 34c reduces the stress generated when the organic EL element board 10 is warped or expanded and prevents the cathode protective layer 34a from separating from the pixel partitions 28 each having a non-linear shape.

In addition, since the upper surface of the organic buffer layer 34c is substantially flat, the gas barrier layer 34d, which is a hard film, on the organic buffer layer 34c is able to have a flat surface. With this configuration, stress is not concentrated on any portion of the gas barrier layer 34d, preventing generation of a crack in the gas barrier layer 34d. In addition, since the pixel partitions 28 are covered by the organic buffer layer 34c that fills the concave portions, the uniformity of the thickness of a black matrix 36a or coloring portions 36R, 36G, and 36B on the gas barrier 34d is effectively improved.

The organic buffer layer 34c may be formed of an epoxy-based resin or a coating-type inorganic material (oxide silicon, for example), which has high thermal stability. In addition, the organic buffer layer 34c is able to have a flat surface when formed by coating according to the screen printing technique. In other words, the organic buffer layer 34c also functions as a planarizing layer for reducing the convexities and concavities in the surface of the cathode protective layer 34a and the cover layer 34b. The organic buffer layer 34c has a thickness of about 2 μm.

The gas barrier 34d is provided to prevent entry of oxygen or moisture. The bas barrier 34d prevents deterioration of the organic EL element 30 caused by the oxygen or the moisture, for example. The gas barrier layer 34d may be formed of a silicon based material having light permeability and a high gas barrier property, such as silicon oxynitride (SiON).

The color filter 36 is disposed over the gas barrier layer 34d. Specifically, a red coloring portion 36R, a green coloring portion 36G, and a blue coloring portion 36B, which constitute the color filter 36, are disposed over the gas barrier layer 34d, and the black matrix 36a is positioned between the coloring portions 36R, 36G, and 36B.

The black matrix 36a is a light blocking layer formed of a resin material including a pigment such as carbon black, for example. The black matrix 36a prevents light emitted from the coloring portions 36R, 36G, and 36B from escaping to adjacent pixel regions for proper color conversion.

The counter board 41 is disposed over the color filter 36 with the bonding layer 42 being disposed therebetween. The counter board 41 may be a transparent board formed of glass, for example. The bonding layer 42 may be formed of a transparent resin material. Examples of the transparent material include a urethane resin material, an acrylic resin material, an epoxy resin material, and a polyolefin resin material.

The bonding layer 42 completely fills in a space in the organic EL device 100 defined by the sealing member 37. The bonding layer 42 fixes the counter board 41 to the organic EL element board 10, which faces the counter board 41. In addition, the bonding layer 42 functions as a buffer for a mechanical impact from outside so as to protect the organic EL element 30 and the gas barrier layer 34d, for example.

The sealing member 37 is disposed between the organic EL element board 10 and the counter board 41 at their peripheral portions. The sealing member 37 may be formed of an epoxy material, for example, which increases in viscosity thereof when cured by ultraviolet light.

Method of Producing Organic EL Device

Figure 4:
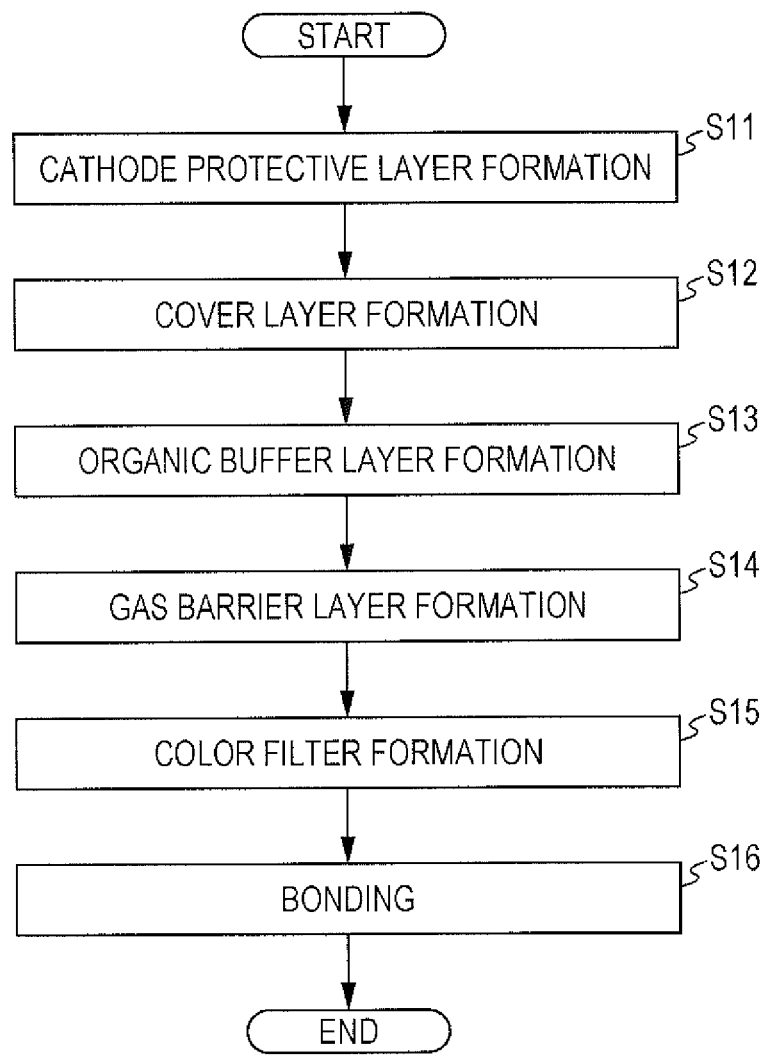
FIG. 4 is a flowchart indicating a method of producing the organic EL device.
Figure 5:
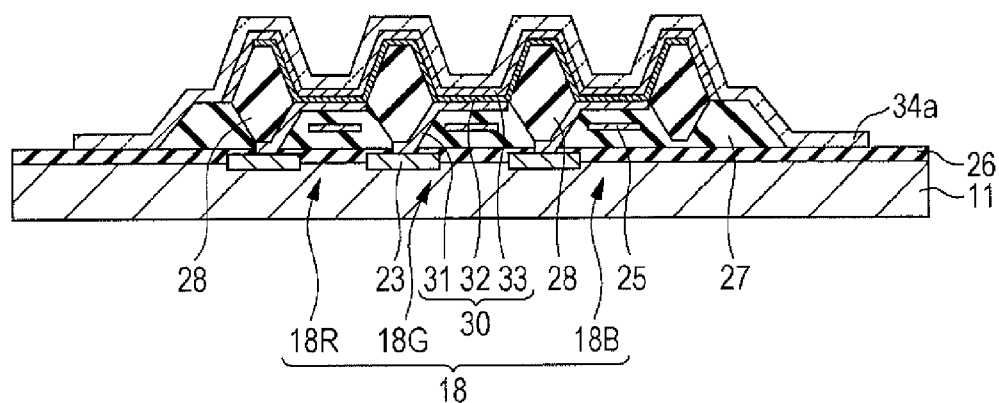
FIG. 5 is a schematic cross-sectional view illustrating a step in the method of producing the organic EL device.
Figure 6:
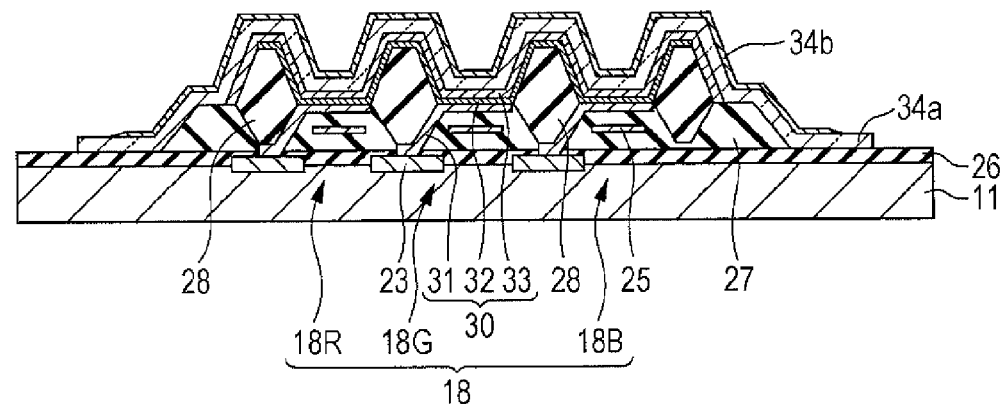
FIG. 6 is a schematic cross-sectional view illustrating a step in the method of producing the organic EL device.
Figure 7:
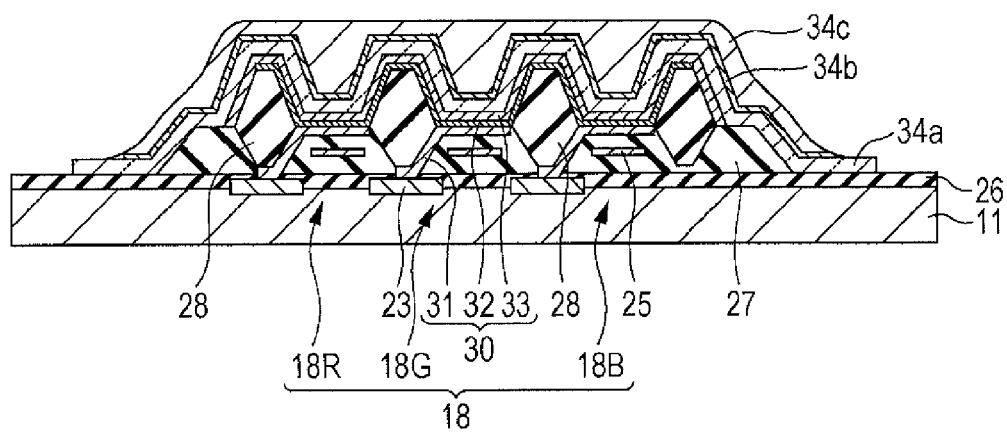
FIG. 7 is a schematic cross-sectional view illustrating a step in the method of producing the organic EL device.

A method of producing an organic EL device according to the embodiment is described with reference to FIG. 4 to FIG. 7. FIG. 4 is a flowchart indicating the method of producing the organic EL device. FIG. 5 to FIG. 7 are schematic cross-sectional views each illustrating a step in the method of producing the organic EL device.

As indicated in FIG. 4, the method of producing the organic EL device 100 of the embodiment includes a formation step of a cathode protective layer (S11), a formation step of a cover layer (S12), a formation step of an organic buffer layer (S13), a formation step of a gas barrier (S14), a formation step of a color filter (S15), and a bonding step (S16). The drive transistor 23 and the organic EL element 30 may be formed on the base member 11 by any known method.

Thus, FIG. 5 to FIG. 12 do not illustrate the configurations of the drive transistor 23 and the organic EL element 30 on the base member 11. Hereinafter, characteristic portions in the method of producing the organic EL device 100 according to the invention are mainly described.

In S11, as indicated in FIG. 4, the cathode protective layer 34a is formed so as to cover the counter electrode 33. Specifically, as illustrated in FIG. 5, the cathode protective layer 34a formed of silicon oxynitride (SiON), for example, is formed over the counter electrode 33 of the partially formed organic EL element board 10.

The cathode protective layer 34a is formed by a vacuum deposition process or a sputtering process, for example. The thickness of the cathode protective layer 34a is about 200 nm, for example.

In S12, the cover layer 34b is formed. Specifically, as illustrated in FIG. 6, the cover layer 34b is formed over the cathode protective layer 34a by the vacuum deposition, for example. A material of the cover layer 34b may be an organic low-molecular-weight material such as Alq3. The thickness of the cover layer 34b is in a range of about 100 nm to 500 nm, for example.

Figure 8:
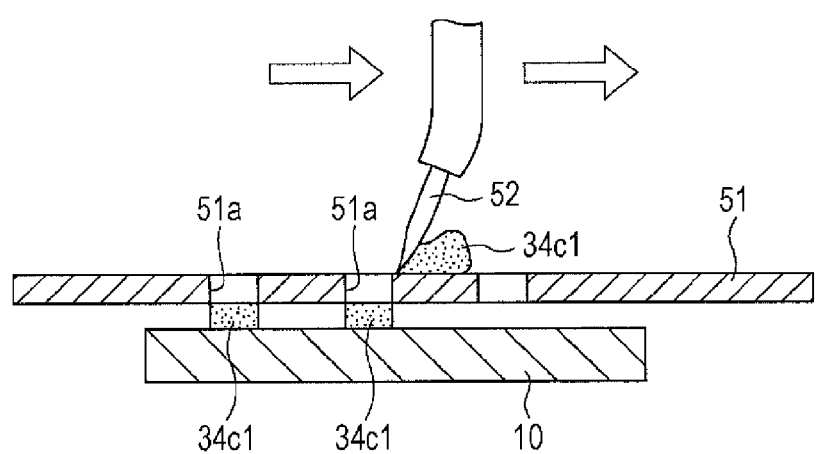
FIG. 8 is a schematic cross-sectional view indicating how screen printing is performed.

In S13, the organic buffer layer 34c is formed. Specifically, as illustrated in FIG. 8, the organic buffer layer 34c is formed by a screen printing technique. FIG. 8 is a schematic cross-sectional view illustrating how the screen printing is performed.

As illustrated in FIG. 8, a screen printing plate 51 is disposed above the partially formed organic EL element board 10 such that a solution 34c1, which forms the organic buffer layer 34c, is selectively supplied. A squeegee 52 for spreading the solution 34c1 is disposed above the screen printing plate 51. The screen printing plate 51 is formed of stainless steel, for example.

The solution 34c1 includes a thermoset epoxy resin having transparency and a solvent for the epoxy resin. The solution 34c1 is applied according to the screen printing technique and dried to form the organic buffer layer 34c formed of the epoxy resin. Specifically, the solution 34c1 that has been subjected to the screen printing under a reduced pressure is heated in a range of 60° C. to 100° C. so as to be cured. The thickness of the organic buffer layer 34c is about 2 μm, for example.

Specifically, the solution 34c1 is supplied onto the screen printing plate 51 and spread along the surface of the screen printing plate 51 by the squeegee 52. This causes the solution 34c1 to be applied onto the partially formed organic EL element board 10 through openings 51a in the screen printing plate 51.

Then, the solution 34c1 applied on the screen printing plate 51 is heated so as to be cured. As a result, the organic buffer layer 34c as illustrated in FIG. 7 is formed.

During the above operation, the screen printing plate 51 is positioned close to the partially formed organic EL element board 10 in order to produce the organic buffer layer 34c having a small thickness. This may cause the screen printing plate 51 to be in contact with the partially formed organic EL element board 10. In some cases, the cathode protective layer 34a of the organic EL element board 10 may be in contact with the screen printing plate 51 if the organic EL element board 10 does not include the cover layer 34b. In such a case, the cathode protective layer 34a may have a crack, and a component of the organic buffer layer 34c may pass through the crack of the cathode protective 34a, leading to deterioration of the counter electrode 33.

However, in the method according to the invention, the cover layer 34b is formed over the cathode protective layer 34a. If the screen printing plate 51 comes in contact with the partially formed organic EL element board 10 during the screen printing, the cover layer 34b absorbs impact of the contact, reducing the damage to the cathode protective layer 34a.

In other words, the cover layer 34b functions as a cushion when the screen printing plate 51 comes in contact with the partially formed organic EL element board 10 during the formation of the organic buffer layer 34c having a small thickness. Thus, the cathode protective layer 34a is unlikely to be damaged, reducing the deterioration of the counter electrode 33. As a result, generation of a non-light-emitting area at which the organic EL element 30 does not emit light is reduced. In addition, the organic buffer layer 34c having a small thickness improves the luminance of the light emitted from the organic EL device 100.

Figure 9:
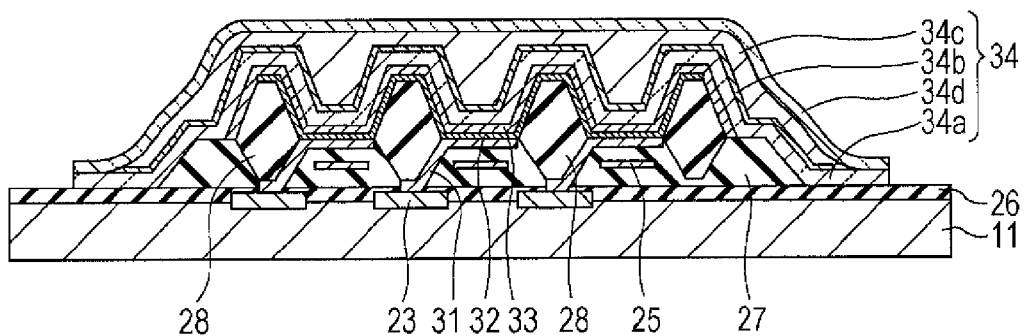
FIG. 9 is a schematic cross-sectional view illustrating a step in the method of producing the organic EL device.

In S14, the gas barrier layer 34d is formed. Specifically, as illustrated in FIG. 9, the gas barrier layer 34d is formed over the organic buffer layer 34c by a vacuum deposition process or a sputtering process, for example. The gas barrier layer 34d is formed of silicon oxynitride (SiON), for example. The thickness of the gas barrier layer 34d is in a range of about 200 nm to 400 nm.

If the thickness of each of the cathode protective layer 34a and the gas barrier layer 34d is made larger, such layers have higher gas barrier characteristics, but also readily have a crack when expended or contracted. Thus, the thickness of the cathode protective layer 34a is preferably in the range of about 200 nm to 400 nm.

Figure 10:
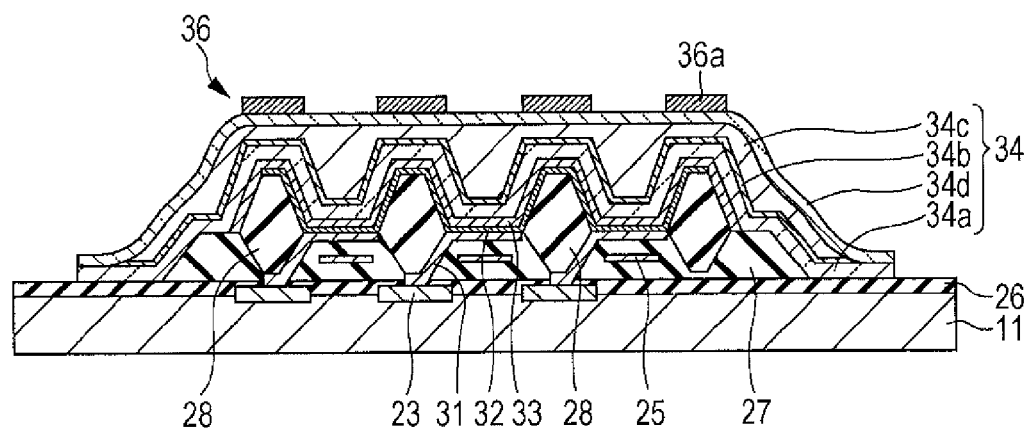
FIG. 10 is a schematic cross-sectional view illustrating a step in the method of producing the organic EL device.

In S15, the color filter 36 is formed. Specifically, as illustrated in FIG. 10, a black matrix 36a is formed on the gas barrier layer 34d. A liquid material of the black matrix 36a is applied on the surface of the gas barrier layer 34d according to an ink jet method, for example, under an atmospheric environment to form the black matrix 36a. Then, the liquid material of the black matrix 36a is dried so as to be cured.

Figure 11:
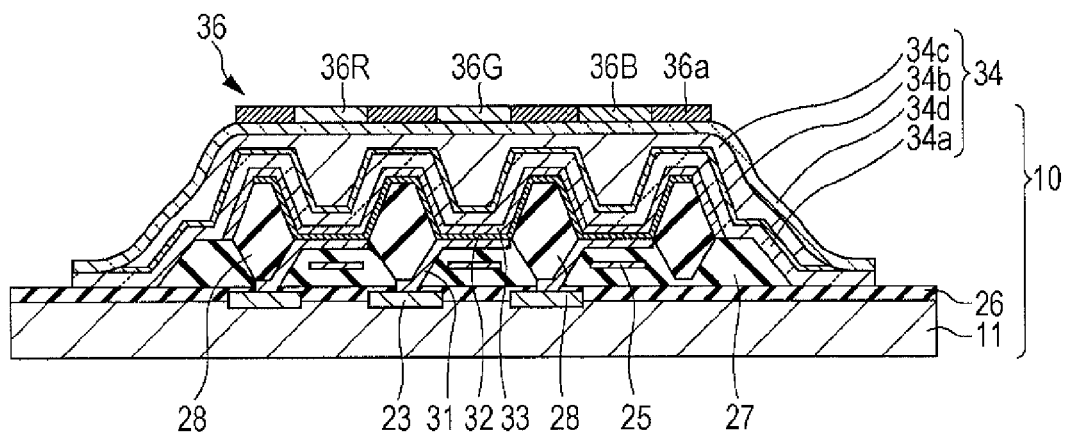
FIG. 11 is a schematic cross-sectional view illustrating a step in the method of producing the organic EL device.

Then, as illustrated in FIG. 11, the coloring portions 36R, 36G, and 36B are formed on the partially formed organic EL element board 10 including the black matrix 36a. Specifically, liquid materials of the coloring portions 36R, 36G, and 36B are applied to spaces between portions of the black matrix 36a on the surface of the gas barrier layer 34d by the ink jet method under an atmospheric environment. Then, the partially formed organic EL element board 10 on which the liquid materials of the coloring portions 36R, 36G, and 36B are applied is dried so as to cure the liquid materials. As a result, the color filter 36 including the coloring portions 36R, 36G, and 36B corresponding to the sub pixels 18R, 18G, and 18B, respectively, is obtained.

Figure 12:
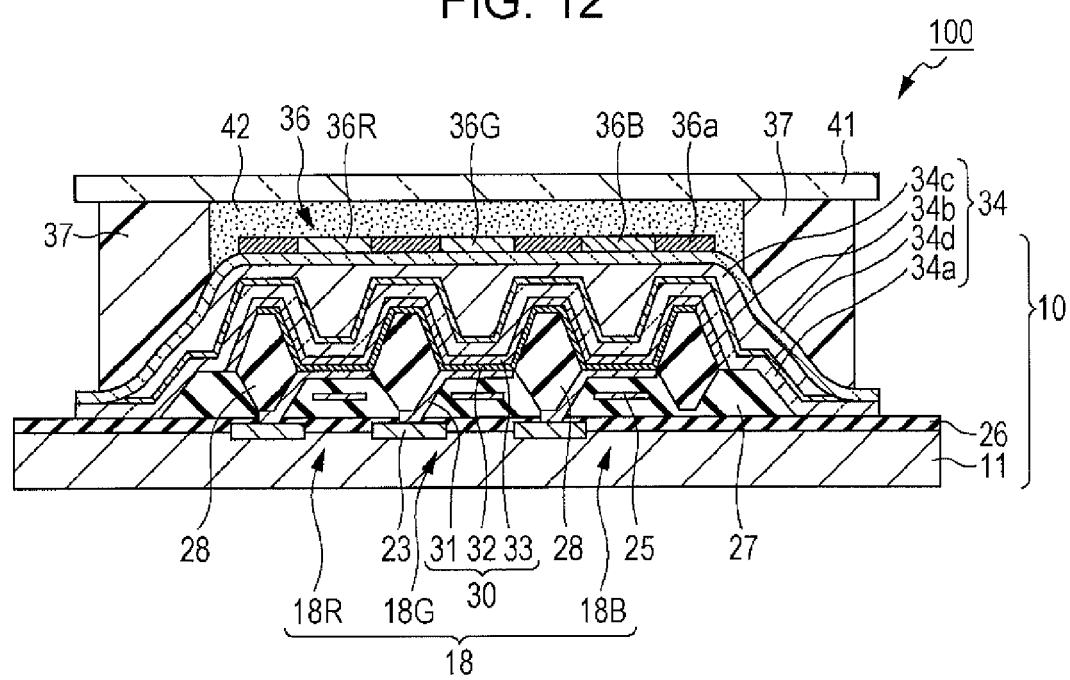
FIG. 12 is a schematic cross-sectional view illustrating a step in the method of producing the organic EL device.

In S16, the organic EL element board 10 and the counter board 41 are bonded together. Specifically, as illustrated in FIG. 12, the counter board 41 having liquid materials of the bonding layer 42 and the sealing member 37 thereon is irradiated with ultraviolet light so as to preliminarily cure the sealing member 37.

Then, the organic EL element board 10 and the counter board 41 are bonded to be tightly attached to each other. Then, the assembly of the organic EL element board 10 and the counter board 41 is heated under an atmospheric environment such that the preliminarily cured sealing member 37 and the bonding layer 42 are thermally cured. As a result, the organic EL device 100 is completed.

Organic Compound Material

Organic compound materials (including the above-described organic low-molecular-weight material) that may be used to form the cover layer are described with reference to FIG. 13. FIG. 13 is a chart indicating characteristics of the organic compound materials for comparison.

The chart in FIG. 13 includes names of organic compound materials in sections A to K. In addition, the organic compound materials in the sections A to K are evaluated in terms of characteristics such as evaporability, cushioning characteristics, Young's modulus, and compatibility with epoxy. In the chart, the organic compound materials are evaluated as EXCELLENT, GOOD, or FAIR for each of the characteristics.

Examples of the organic low-molecular compound in the section A include tris(8-hydroxyquinolinato)aluminum (Alq3). The organic compound materials in the other sections B to K are organic high-molecular-weight compounds. Examples of the high-molecular-weight compounds include polyimide, polyethylene, polyuria, polyurethane, polytetrafluoroethylene, acrylic, vinyl polymer, polyester, polypropylene, and polystyrene.

The film formation stability (vapor deposition) is determined by whether a thin film, which is to be the cover layer 34b, is uniformly formed or not when each of the materials in the sections A to K is deposited by a deposition system. The formation of the thin film improves permeability of the organic EL device 100. In addition, the formation of the uniform film reduces color unevenness and improves display quality.

The organic low-molecular compound in the section A is easily deposited. Since some of the organic high-molecular-weight compounds (molecular weight of 10,000 or more) are decomposed during deposition due to their high boiling points, only limited high-molecular-weight compounds are suitable for deposition.

The cushioning characteristics are related to the Young's modulus. The material having high cushioning characteristics are able to absorb the physical damage during the screen printing, and thus the cathode protective layer 34a positioned below the cover layer 34b is unlikely to be damaged.

The Young's modulus of the material of the cover layer 34b is preferably in a range of 1 GPa to 5 GPa. The cover layer 34b made of a material having a high Young's modulus is relatively hard. The cover layer 34b having a low Young's modulus is relatively soft. The cover layer 34b formed of a material having the Young's modulus in the above range readily absorbs the physical damage (readily exhibits cushioning characteristic).

The chemical stability to epoxy (compatibility with epoxy) is determined by whether an adverse effect is caused by a chemical reaction, for example, between the material of the cover layer 34b and the material of the organic buffer layer 34c on the cover layer 34b. When polyimide in the section B is selected as the material of the cover layer 34b and the epoxy resin is used to form the organic buffer layer 34c, for example, the compatibility with epoxy is evaluated as EXCELLENT, since chemical stability is observed, and no adverse effect is observed.

In view of the above, polyimide in the section B, polyethylene in the section C, or acrylic in the section G, for example, is preferably selected as the material of the cover layer 34b. The other materials may also be used as the material of the cover layer 34b.

The material may be selected in view of the distance between the cover layer 34b and the screen printing plate 51 during the formation of the organic buffer layer 34c on the cover layer 34b, or in view of a degree of the damage caused by the physical contact.

As described above in detail, the method of producing the organic EL device 100 according to the present embodiment provides the flowing advantages.

(1) According to the method of producing the organic EL device 100 in this embodiment, the cover layer 34b is formed between the cathode protective layer 34a and the organic buffer layer 34c. With this configuration, the cathode protective layer 34a positioned below the cover layer 34b is unlikely to be damaged when a portion of a screen printer (screen printing plate 51, for example) for forming the organic buffer layer 34c comes in contact with the partially formed organic EL element board 10 during the formation of the organic buffer layer 34c, for example. Thus, a crack in the cathode protective layer 34a, possibly due to a direct contact between the screen printing plate 51 and the cathode protective layer 34a, is prevented, reducing deterioration of the counter electrode 33 disposed below the cathode protective layer 34a. As a result, generation of a non-light-emitting area is reduced.

(2) According to the method of producing the organic EL device 100 of the embodiment, since the edge of the cover layer 34b is positioned outwardly from the edge of the display area E0 in plan view, the cover layer 34b at least covers the display area E0 (light emitting area). With this configuration, the display area E0 (light emitting area) is protected by the cover layer 34b if a portion of the screen printer comes in contact with the partially formed organic EL element board 10 during the formation of the organic buffer layer 34c by the screen printing technique.

(3) According to the method of producing the organic EL device 100 of the embodiment, since the screen printing plate 51 is able to be positioned close to the organic EL element board 10 during the formation of the organic buffer layer 34c by the screen printing technique, the organic buffer layer 34c having a small thickness is able to be formed. Thus, luminance of the light emitted from the organic EL device 100 is improved.

Aspects of the present invention are not limited to the above-described embodiment. Any modifications may be suitably added to the invention without departing from the scope of the invention understood from the claims and the description. Such modifications are in the technical scope of the aspects of the invention. The invention may be embodied as following.

First Modification

The method of forming the cover layer 34b is not limited to the above-described vacuum deposition process using the organic low-molecular-weight material, and any method that can form a thin film may be used. Methods other than the vacuum deposition process may be used to form the cover layer 34b.

Second Modification

The method of forming the organic buffer layer 34c is not limited to the above-described screen printing technique. Other printing techniques such as a gravure printing technique may be employed or any other transfer techniques may be employed to form the organic buffer layer 34c.

The entire disclosure of Japanese Patent Application No.: 2015-043263, filed Mar. 5, 2015 and No.: 2015-180446, filed Sep. 14, 2015 are expressly incorporated by reference herein.

What is claimed is:

1. A method of producing an organic EL device comprising:
    forming an organic EL element including a pixel electrode, a functional layer, and a counter electrode over a substrate;
    forming a cathode protective layer over the organic EL element;
    forming a cover layer over the cathode protective layer, the cover layer having a thickness in a range of 100 nm to 500 nm;
    forming an organic buffer layer over the cover layer; and
    forming a gas barrier layer over the organic buffer layer.

2. The method of producing the organic EL device according to claim 1, wherein the organic buffer layer is formed over the cover layer by a screen printing technique.

3. The method of producing the organic EL device according to claim 1, wherein the cover layer is formed such that an edge of the cover layer is positioned outwardly from an edge of a display area in plan view and positioned inwardly from an edge of each of the cathode protective layer and the gas barrier in plan view.

4. The method of producing the organic EL device according to claim 1, wherein the cover layer is formed of an organic low-molecular-weight material.

5. A method of producing an organic EL device comprising:
    forming an organic EL element including a pixel electrode, a functional layer, and a counter electrode over a substrate;
    forming a cathode protective layer over the organic EL element;
    forming a cover layer having a Young's modulus in a range of 0.1 GPa to 10 GPa over the cathode protective layer, the cover layer having a thickness in a range of 100 nm to 500 nm;
    forming an organic buffer layer over the cover layer; and
    forming a gas barrier layer over the organic buffer layer.

6. The method of producing the organic EL device according to claim 5, wherein the organic buffer layer is formed over the cover layer by a screen printing technique.

7. The method of producing the organic EL device according to claim 5, wherein the cover layer is formed such that an edge of the cover layer is positioned outwardly from an edge of a display area and positioned inwardly from an edge of each of the cathode protective layer and the gas barrier in plan view.

8. The method of producing the organic EL device according to claim 5, wherein the cover layer is formed of an organic compound material.

9. The method of producing the organic EL device according to claim 8, wherein the organic compound material is a high-molecular-weight compound.

* * * * *